(12) United States Patent
Ito

(10) Patent No.: US 7,356,296 B2
(45) Date of Patent: Apr. 8, 2008

(54) ENDLESS BELT TYPE TRANSFERRING APPARATUS AND IMAGE FORMING APPARATUS

(75) Inventor: Michiaki Ito, Tokyo (JP)

(73) Assignee: Oki Data Corporation, Tokyo (JP)

(*) Notice: Subject to any disclaimer, the term of this patent is extended or adjusted under 35 U.S.C. 154(b) by 7 days.

(21) Appl. No.: 11/180,358

(22) Filed: Jul. 13, 2005

(65) Prior Publication Data

US 2005/0249525 A1 Nov. 10, 2005
US 2006/0210323 A9 Sep. 21, 2006

(30) Foreign Application Priority Data

Jul. 15, 2004 (JP) ............... 2004-208396

(51) Int. Cl.
*G03G 15/01* (2006.01)
(52) U.S. Cl. .................... 399/303; 399/302
(58) Field of Classification Search .......... 399/299, 399/302, 303, 308; 528/170
See application file for complete search history.

(56) References Cited

U.S. PATENT DOCUMENTS

| 5,922,440 | A | 7/1999 | Schlueter, Jr. et al. |
| 5,930,573 | A | 7/1999 | Miyamoto et al. |
| 6,281,324 | B1* | 8/2001 | Nakamura et al. ........ 528/170 |
| 6,336,026 | B1 | 1/2002 | Heeks et al. |
| 6,673,407 | B2* | 1/2004 | Hara et al. ............ 428/36.9 |
| 2006/0102750 | A1 | 5/2006 | Grether |

FOREIGN PATENT DOCUMENTS

| DE | 102 46 333 A1 | 4/2004 |
| EP | 1 014 217 A2 | 6/2000 |
| EP | 1 650 609 A1 | 4/2006 |
| JP | 09-297472 A | 11/1997 |
| WO | 2004/033807 A1 | 4/2004 |

\* cited by examiner

*Primary Examiner*—Hoang Ngo
(74) *Attorney, Agent, or Firm*—Panitch Schwarze Belisario & Nadel LLP

(57) ABSTRACT

An endless belt transports a recording medium through image forming sections and transfers toner images from corresponding ones of the image forming sections onto the recording medium. The endless belt has a surface resistivity and a volume resistivity. The surface resistivity and the volume resistivity are related such that $0.3 \leq (\log \rho_s - \log \rho_v) \leq 1.3$ where $\rho_s$ is the surface resistivity in $\Omega/\square$ measured after a voltage of substantially 500 V is applied to the endless belt for ten seconds and $\rho_v$ is the volume resistivity in $\Omega \cdot cm$ ten after a voltage of substantially 250 V is applied to the endless belt for ten seconds.

12 Claims, 6 Drawing Sheets

FIG.5A

HALFTONE PRINTING ON 100%-RECYCLED MEDIUM

| × | 10°C20% | 23°C50% | 28°C85% |
|---|---|---|---|
| 0.1 | △ | ○ | △ |
| 0.3 | ○ | ○ | ○ |
| 0.6 | ○ | ○ | ○ |
| 0.8 | ○ | ○ | ○ |
| 1.3 | ○ | ○ | ○ |
| 1.5 | △ | ○ | ○ |

FIG.5B

SOLID PRINTING ON 100%-RECYCLED MEDIUM

| × | 10°C20% | 23°C50% | 28°C85% |
|---|---|---|---|
| 0.1 | △ | ○ | × |
| 0.3 | ○ | ○ | ○ |
| 0.6 | ○ | ○ | ○ |
| 0.8 | ○ | ○ | ○ |
| 1.3 | ○ | ○ | ○ |
| 1.5 | × | ○ | ○ |

FIG.5C

HALFTONE PRINTING ON OHP

| × | 10°C20% | 23°C50% | 28°C85% |
|---|---|---|---|
| 0.1 | × | ○ | △ |
| 0.3 | ○ | ○ | ○ |
| 0.6 | ○ | ○ | ○ |
| 0.8 | ○ | ○ | ○ |
| 1.3 | ○ | ○ | ○ |
| 1.5 | × | ○ | ○ |

FIG.5D

SOLID PRINTING ON OHP

| × | 10°C20% | 23°C50% | 28°C85% |
|---|---|---|---|
| 0.1 | × | ○ | × |
| 0.3 | ○ | ○ | ○ |
| 0.6 | ○ | ○ | ○ |
| 0.8 | ○ | ○ | ○ |
| 1.3 | × | ○ | ○ |
| 1.5 | × | ○ | ○ |

ENDLESS BELT TYPE TRANSFERRING APPARATUS AND IMAGE FORMING APPARATUS

BACKGROUND OF THE INVENTION

1. Field of the Invention

The present invention relates to electrophotographic image forming apparatuses such as printers, copying machines, and facsimile machines that form an image on a recording medium. More particularly, the invention relates to an image forming apparatus with an endless belt type transferring apparatus that transfers a recording medium to a toner image forming section.

2. Description of the Related Art

A conventional image forming apparatus employs an endless-belt type transferring apparatus. Because voltage is applied to a print medium through the endless belt transferring apparatus, some specific electrical properties are required of the endless belt. For example, the surface resistance of the endless belt is selected to be in a specific range for high quality images.

The conventional endless belt is manufactured so that the surface resistance is within a specific range merely at room temperature and normal humidity. Therefore, when operating conditions of the endless belt type transferring apparatus change due to changes in temperature and humidity, the surface resistance of the endless belt changes, failing to maintain uniform transfer performance. Thus, the conventional endless belt type transferring apparatus is not sufficient for obtaining high quality images.

SUMMARY OF THE INVENTION

An object of the present invention is to provide an endless belt that maintains good, uniform transfer performance and provides high quality images.

Another object of the invention is to provide an endless belt having a surface resistivity $\rho$ s and a volume resistivity $\rho$ v such that $0.3 \leq (\log \rho \text{ s} - \log \rho \text{ v}) \leq 1.3$.

An endless belt transports a recording medium through image forming sections and transfers toner images from corresponding ones of the image forming sections onto the recording medium. The endless belt has a surface resistivity and a volume resistivity. The surface resistivity and the volume resistivity are related such that $0.3 \leq (\log \rho \text{ s} - \log \rho \text{ v}) \leq 1.3$ where $\rho$ s is the surface resistivity in $\Omega/\square$ after a voltage of substantially 500 V is applied for ten seconds to the endless belt and $\rho$ v is the volume resistivity in $\Omega \cdot \text{cm}$ after a voltage of substantially 250 V is applied for ten seconds to the endless belt.

The endless belt has a single layer structure.

The endless belt is made of a base material having a Young's Modulus greater than 200 MPa.

The base material of the endless belt is polyamide-imide.

The base material of the endless belt is polyimide.

The endless belt contains nano carbon.

The endless belt is made by centrifugal molding.

The endless belt is made by using a family mold.

An image forming apparatus incorporates the aforementioned endless belt. The image forming apparatus includes a photoconductor, a charging unit, an exposing unit, a developing unit, and a transfer unit. The charging unit charges a surface of the photoconductive drum. The exposing unit illuminates the charged surface of the photoconductor to form an electrostatic latent image. The developing unit develops the electrostatic latent image with toner into a visible image. The transfer unit transfers the visible image onto a recording medium carried on the endless belt.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limiting the present invention, and wherein:

FIG. 5A illustrates transfer results when halftone printing was performed under typical environmental conditions using a 100%-recycled paper;

FIG. 5B illustrates transfer results when solid printing was performed under typical environmental conditions using a 100%-recycled paper;

FIG. 5C illustrates transfer results when halftone printing was performed under typical environmental conditions using a transparency as a print medium;

FIG. 5D illustrates transfer results when solid printing was performed under typical environmental conditions using a transparency as a print medium;

DETAILED DESCRIPTION OF THE INVENTION

The present invention will be described in detail with reference to the accompanying drawings.

First Embodiment

Figure 1:
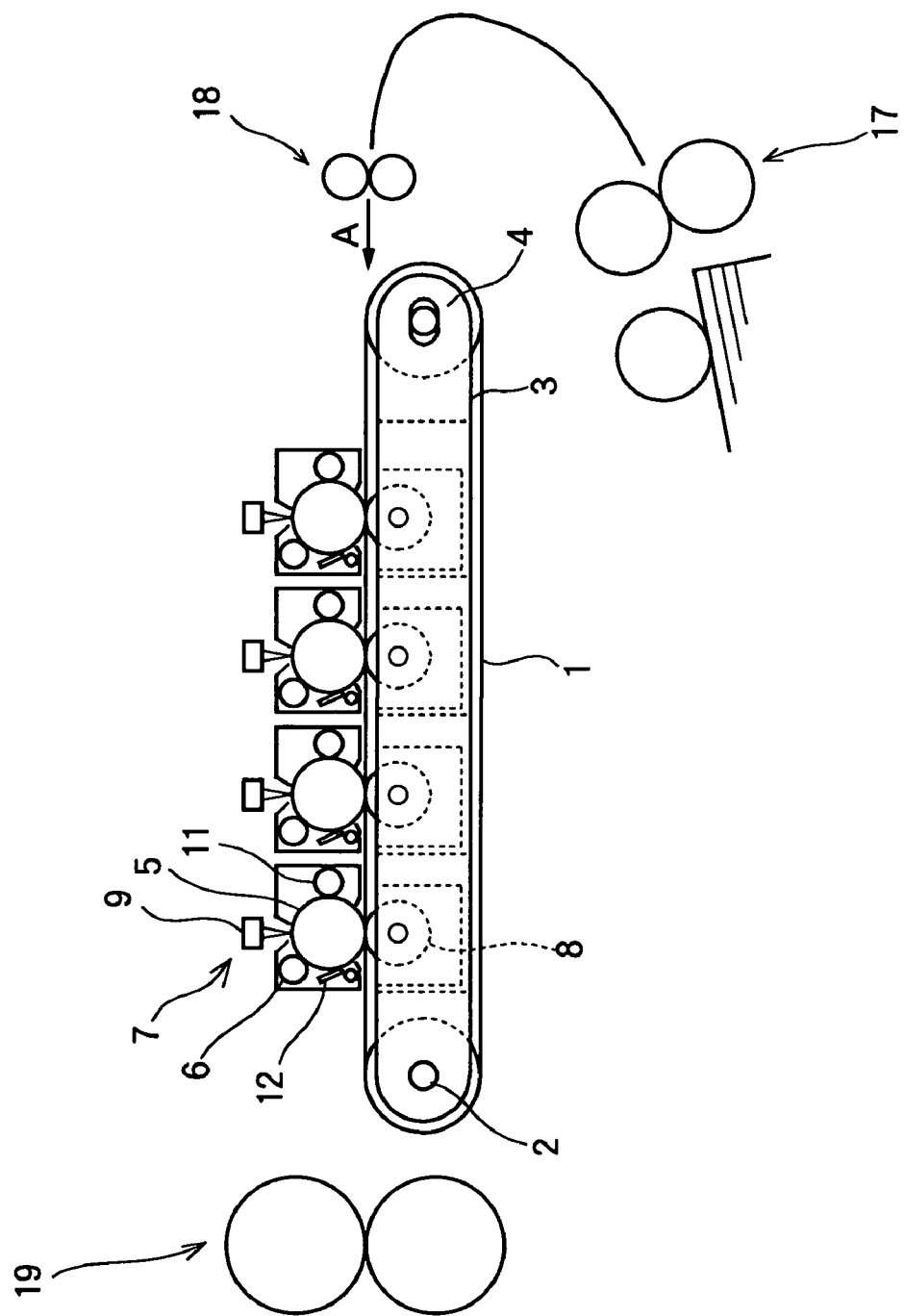
FIG. 1 is a side view of an image forming apparatus according to the invention.
Figure 2:
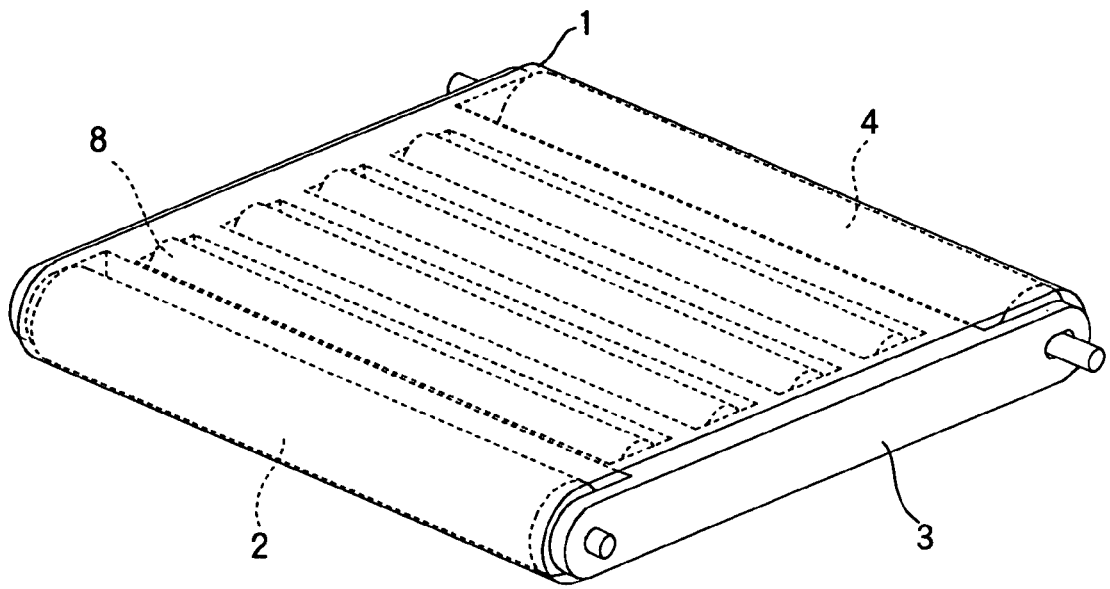
FIG. 2 is a perspective view of an endless belt type transferring apparatus.

FIG. 1 is a side view of a color image forming apparatus according to the invention. FIG. 2 is a perspective view of an endless belt type transferring apparatus. Like elements have been given like numerals throughout the drawings.

Referring to FIG. 1, the color image forming apparatus includes an endless belt type transferring apparatus, four toner image forming sections 7, feeding rollers 17, registry rollers 18, and fixing unit 19. Referring to FIG. 2, the endless belt type transferring apparatus includes an endless belt 1, drive roller 2, belt frame 3, tension roller 4, and four transfer rollers 8.

The endless belt 1 is entrained about the drive roller 2 and the tension roller 4 that are rotatably supported on the belt frame 3. An urging member, not shown, urges the tension roller 4 against the endless belt 1 to apply tension to the endless belt 1. The four transfer rollers 8 are rotatably supported on the belt frame 3. The four transfer rollers 8 oppose corresponding toner image forming sections 7 for the respective colors: yellow, magenta, cyan, and black images.

The toner image forming sections 7 are aligned along a direction in which the endless belt runs. Each of the toner image forming sections 7 includes a hollow cylindrical photoconductive drum 5, a charging unit 6 that charges the surface of the photoconductive drum 5, an exposing unit 9 that illuminates the charged surface of the photoconductive drum 5 to form an electrostatic latent image, a developing unit 11 that develops the electrostatic latent image with toner into a visible image, a transfer roller 8 that transfers the visible image onto a recording medium, and a cleaning unit that cleans the surface of the photoconductive drum 5 after transfer.

The feeding rollers 17 feed the print medium to the registry rollers 18, which in turn minimize the skew between the print medium and the endless belt. Then, the registry rollers 18 cause the print medium to advance to the toner image forming sections in timed relation with the image formation on the photoconductive drum 5. The print medium is advanced in a direction shown by arrow A, and passes through the four toner image forming sections 7. As the print medium passes through the image forming sections 7, toner images of corresponding colors are transferred onto the print medium by the Coulomb force and pressure applied by the transfer rollers 17, the images being transferred one over the other in registration. The print medium then advances to the fixing unit 19 where the toner images on the print medium are fused under heat and pressure into a permanent full color image. Finally, the print medium is discharged from the image forming apparatus.

The endless belt type transferring apparatus according to the present invention employs an endless belt having a surface resistivity and a volume resistivity as follows:

Experiment was conducted to derive the characters of the endless belt according to the first embodiment. According to Japanese Industrial Standard K6911 (JIS K6911), a voltage of 500 V was applied to the endless belt for ten seconds using a round electrode. Subsequently, the surface resistivity $\rho s$ ($\Omega/\square$) of the endless belt was measured. A voltage of 200 V was applied to the endless belt for 10 seconds and subsequently the volume resistivity $\rho v$ ($\Omega \cdot cm$) was measured. Then, X is determined as follows:

$$X = \log \rho s - \log \rho v \quad (1)$$

where "log" is common logarithm and X is referred to as "difference".

Figure 3A:
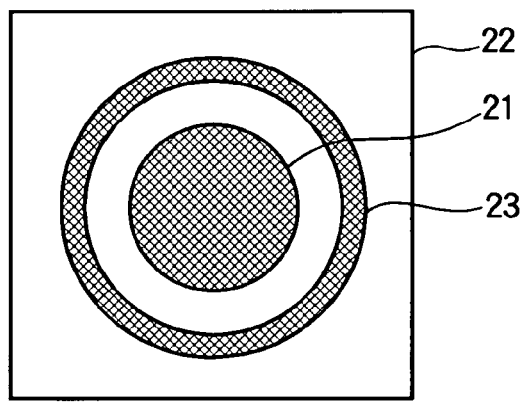
FIGS. 3A and 3B illustrate a method of measuring the surface resistivity of an endless belt, FIG. 3A being a top view and FIG. 3B being a side view.
Figure 3B:
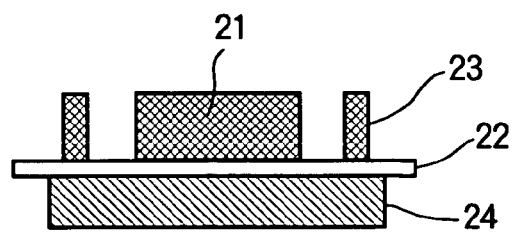
Figure 4A:
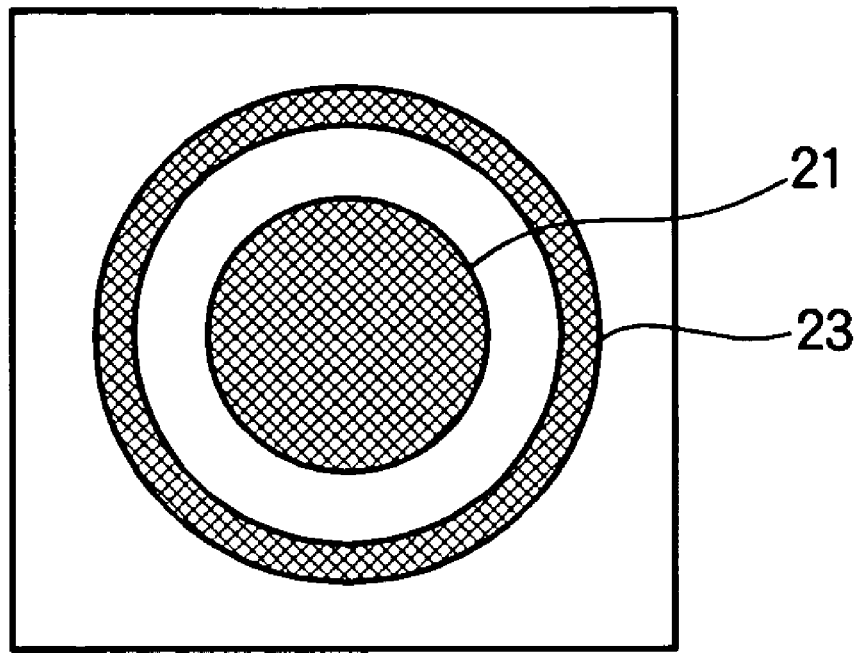
FIGS. 4A and 4B illustrate a method of measuring the volume resistivity of the endless belt, FIG. 4A being a top view and FIG. 4B being a side view.
Figure 4B:
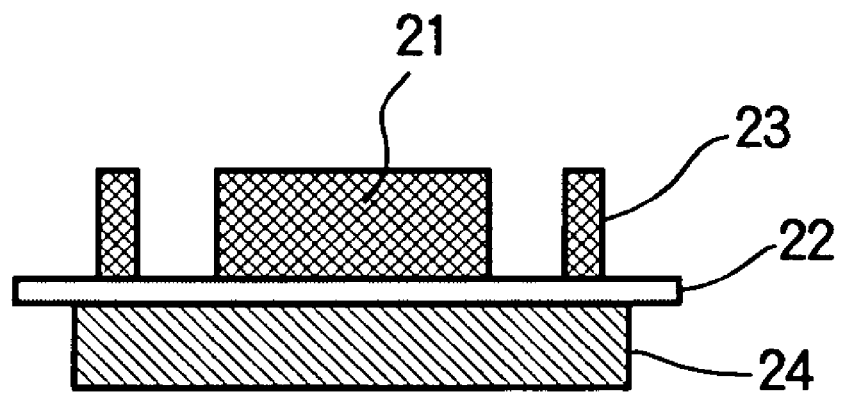

FIGS. 3A and 3B illustrate a method of measuring the surface resistivity $\rho s$ of the endless belt. FIG. 3A is a top view and FIG. 3B is a side view. FIGS. 4A and 4B illustrate a method of measuring the volume resistivity of the endless belt. FIG. 4A is a top view and FIG. 4B is a side view. Referring to FIGS. 3 and 4, the round electrode used is used for measuring the surface resistivity $\rho s$ and volume resistivity $\rho v$. The round electrode includes a disk-like electrode 21 and an annular electrode 23 that are placed on a front surface of a specimen 22, and a flat plate-like electrode 24 that is placed on a back surface of the specimen 22 of the endless belt.

Referring to FIG. 3B, when the surface resistivity is measured, the electrodes 21 and 23 are used as a surface electrode in contact with the front surface of the specimen 22 and the electrode 24 is used as a guard electrode in contact with the back surface. A voltage of 500 V is applied across the surface electrodes 21 and 23 for 10 seconds. Then, the surface resistivity is measured.

Referring to FIG. 4B, when the volume resistivity is measured, the electrode 21 is used as a surface electrode, the electrode 23 is used as a guard electrode in contact with the specimen 22, and the electrode 24 is used as a back surface electrode. The electrodes 21 and 23 are in contact with the front surface of the specimen 22. A voltage of 250 V is applied for 10 seconds across the surface electrode 21 and the back surface electrode 24. Subsequently, the volume resistivity is measured.

The base material of the endless belt is polyimide, which has good durability and mechanical properties. Carbon black is added for providing electrical conductivity. The material is formed into an endless belt by centrifugal molding, the endless belt having a thickness of 100 μm and a diameter of 226 mm. The thus made endless belt has a single-layer structure.

The difference X of the endless belt can be changed by varying the proportions of carbon black and polyamide-imide. Increasing the content of carbon black causes the volume resistivity to change more rapidly than the surface resistivity, allowing manufacturing of an endless belt having various values of X. In this experiment, a total of six different endless belts having values of X, i.e., X=0.1, 0.3, 0.6, 0.8, 1.3, and 1.5, were made and tested.

Printing was carried out to investigate the transfer performance of the endless belt for different values of X.

A4-size 100%-recycled paper and an A4-size transparency (OHP) were used as a printing medium. These two types of medium were selected for the following reasons. The 100%-recycled paper is apt to absorb moisture and quickly dry up, and therefore its electrical resistance changes significantly depending on the environmental conditions. Recycled paper is made totally of recycled pulp without freshly made pulp. Recycled paper has a rough surface compared to bond paper and therefore toner images are difficult to be transferred from the photoconductive drum onto the paper. Thus, 100%-recycled paper is difficult to maintain uniform transfer performance. Transparencies have very high surface resistances that are highly temperature dependent. Thus, transparencies are difficult to maintain uniform transfer performance. When the aforementioned two types of print medium are used, if an endless belt provides good transfer performance, then the endless belt should provide excellent transfer performance when an image is printed on ordinary paper.

Typical operating conditions were selected as follows: 10° C. and 20% RH, 23° C. and 50% RH, and 28° C. and 85% RH.

A halftone print pattern having a density of 50% and a solid print pattern having a density of 100% were used as a test print pattern. These two types of test print patterns were used for the following reasons. A halftone pattern has a low toner density per unit area on the photoconductive drum and therefore transfer of images can be performed with a relatively low voltage. A solid pattern has highest density because toner adheres to the entire surface of the photoconductive drum, requiring a relatively high voltage for transfer of images. In actual transfer, the endless belt is required to uniformly transfer a variety of patterns mixed together randomly onto a sheet of print medium.

FIGS. 5A-5D illustrate the relationship between the difference X of endless belt and transfer performance. FIG. 5A illustrates the transfer results when halftone printing was performed under typical environmental conditions using 100%-recycled paper. FIG. 5B illustrates the transfer results when solid printing was performed under typical environmental conditions using 100%-recycled paper. FIG. 5C illustrates the transfer results when halftone printing was performed under typical environmental conditions using a transparency. FIG. 5D illustrates the transfer results when solid printing was performed under typical environmental conditions using a transparency.

Evaluation was made as follows: In halftone printing, a test pattern having a density of 50% was printed. In solid printing, a test pattern having a density of 100% was printed. The exposing unit 9 illuminated the charged surface of the photoconductive drum 5 to form an electrostatic latent image on the photoconductive drum 5. Then, the developing unit 11 applies toner to the electrostatic latent image to form a toner image. The toner image was transferred onto the print medium and was then fused into a permanent image. After the aforementioned electrophotographic processes were repeated ten times for each of black, yellow, magenta, and cyan, the toner images transferred on the print medium were inspected. Referring to FIGS. 5A-5D, symbols ○, Δ, and X denote the levels of transfer performance. Symbol ○ represents good transfer performance, i.e., image defects such as fuzzy images, blurring, and drop-out of dots were not observed. Symbol Δ represents somewhat deteriorated transfer performance, i.e., one defect was observed in an image and at least one image having such a defect was observed. Symbol X represents poor transfer performance, i.e., two or more defects were observed in one image. Occurrence of image defect at more than one location implies that the density at or in the vicinity of the image defect decreases prominently. Such an image defect makes printed characters unreadable when ordinary character printing is performed.

A large value of X causes defects such as fuzzy images and blurring in a low-temperature and low-humidity environment due to the fact that electrical discharge flushes away the toner particles. The endless belt having X=1.5 in FIG. 5 is this case. Likewise, a small value of X causes defects such as fuzzy image and blurring in a low-temperature and low-humidity environment due to the fact that electrical discharge flushes away toner particles. A small value of X also causes defects such as drop-out of dots in a high-temperature and high-humidity environment due to leakage of transfer current. The endless belt having X=0.1 in FIG. 5 is this case.

Referring to FIG. 5, endless belts having values of X in the range of $0.3 \leq X \leq 1.3$ showed uniform, good transfer performance in halftone and solid printings on 100%-recycled paper medium and transparency under environmental conditions of 10° C. and 20% RH, 23° C. and 50% RH, and 28° C. and 85% RH.

Thus, the endless belt according to the first embodiment has a value of X as follows:

$$0.3 \leq X \leq 1.3 \quad (2)$$

where $X = (\log \rho s - \log \rho v)$

As described above, according to the first embodiment, the values of X in the range of $0.3 \leq X \leq 1.3$ provide uniform, good transfer performance and offers high quality images even when environmental conditions change due to changes in temperature and humidity.

The material of the endless belt is not limited to polyamide-imide but may be other materials whose deformation is within a limited range during its usage. Such materials are resins such as polyimide, polycarbonate, and polyamide having Young's Modulus larger than 200 MPa.

For adding electrical conductivity, a metal oxide, a polymer that conducts electricity, and an ionic conductor may be used alone or in combination.

Second Embodiment

The configuration and operation of an image forming apparatus according to a second embodiment are much the same as those of the first embodiment.

The endless belt according to the first embodiment has the feature that the value of X is in the range expressed by Equation (2). In contrast, an endless belt according to the second embodiment has a feature that the belt contains nano-carbon that adds electrical conductivity to the endless belt.

Nano-carbon is a fibrous material having a diameter in the range of 70 to 160 nm and a length in the range of 15 to 20 μm. Nano carbon is also referred to as nano fiber and is between so-called carbon fiber and so-called carbon nano tube in terms of diameter. The second embodiment employs nano carbon having a diameter in the range of 80 to 150 nm.

Experiment was conducted to evaluate the performance of the endless belt according to the second embodiment. Endless belt A having an X of 0.6 and endless belt B having a value of X of 0.8 were prepared. Endless belt C having a value of X of 0.6 for comparison was also prepared.

The values of X for endless belts A, B, and C were determined as follows: In accordance with Japanese Industrial Standard K6911 (JIS K6911), measurement was made for surface resistivity in the same manner as in FIG. 3, and for volume resistivity in the same manner as in FIG. 4.

The base material of endless belts A and B is polyimide, which has good durability and mechanical properties, and nano carbon having a diameter of 80 nm and a length of 20 μm is added for providing electrical conductivity. The material is formed into an endless belt having a thickness of 100 μm and a diameter of 226 mm using a family mold in FIGS. 6A-6C without rotating the family mold.

Figure 6A:
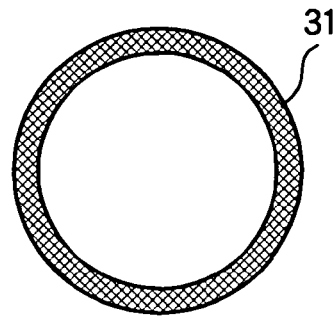
FIG. 6A is a top view of an outer mold of a family mold.
Figure 6B:
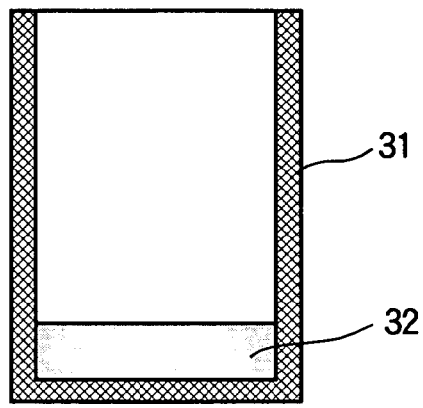
FIG. 6B is a side view of the outer mold of the family mold.
Figure 6C:
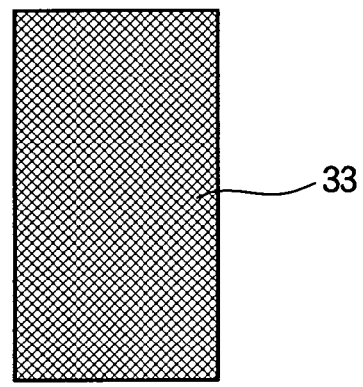
FIG. 6C is a side view of an inner mold of the family mold.
Figure 7:
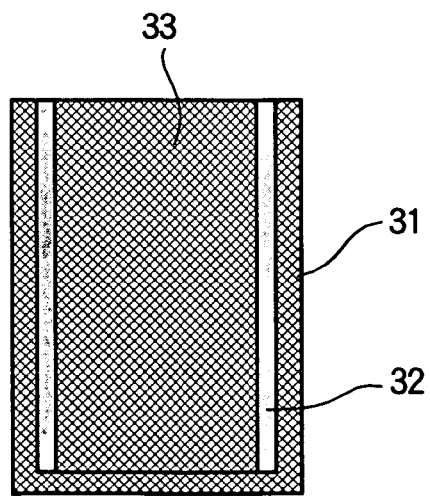
FIG. 7 is a side view when the inner mold is inserted into the outer mold.

The family mold in FIGS. 6A-6C includes a hollow circular cylindrical outer mold 31 and an inner cylinder solid 33. FIG. 6A is a top view of the outer mold 31. FIG. 6B is a side view of the outer mold 31. FIG. 6C is a side view of an inner mold 33. FIG. 7 is a side view when the inner mold 33 is inserted into the outer mold 31. Referring to FIG. 6B, a material 32 (a melt of polyimide or materials for polyimide in a liquid state) is put into the outer mold 31 and then the inner mold 33 is dipped into the material 32 held in the outer mold 31. The outer mold 31 and inner mold 33 are held stationary and are left until the material 32 cures by cooling or heating. Thus, endless belts A and B have a single layer structure.

Endless belt C was made of the same material as endless belts A and B except that silicon nitride was used in place of nano carbon. Endless belt C was made in the same manner as endless belts A and B.

The surface temperature characteristics of endless belts A, B, and C were investigated for a predetermined number of printed pages.

A halftone print pattern having a density of 50% was printed on A4-size 100%-recycled paper in an environment of 28° C. and 85% RH.

Figure 8:
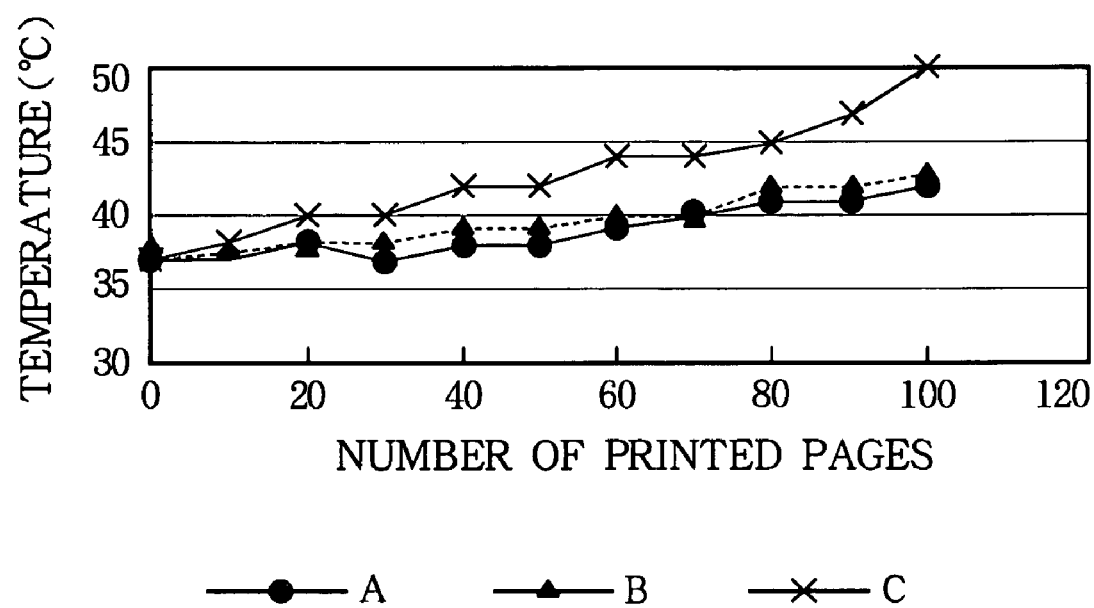
FIG. 8 illustrates the relationship between the surface temperature of the endless belt and the number of printed pages when printing was performed on a 100%-recycled paper in an environment of 28° C. and 85% RH.

FIG. 8 illustrates the relationship between the surface temperature of the endless belts and the number of printed pages when printing was performed on 100% recycled paper in an environment of 28° C. and 85% RH.

Referring to FIG. 8, endless belts A and B exhibit only a small increase in surface temperature as the number of printed pages increases. The endless belts C shows a large increase in surface temperature as the number of printed pages increase. The small increase in surface temperature for endless belts A and B implies that the nano carbon is excellent in the heat radiation characteristic.

The interior temperature of the image forming apparatus is usually high due to heat generation within the image forming apparatus and is affected by the temperature and humidity of an environment in which the image forming apparatus operates. The increase in the temperature of the endless belt gives rise to the following problems. The heat of the surface of the endless belt is transferred to the photoconductive drum 5 and therefore components surrounding the photoconductive drum 5 are subjected to thermal expansion and deterioration. When the surface temperature exceeds a predetermined value, printing may be interrupted until the surface temperature of the endless belt decreases to those of the surrounding components, thereby preventing the problem of increase in the interior temperature of the image forming apparatus. However, the operation of the image forming apparatus in such a manner results in a large amount of inoperative time of the image forming apparatus. This is inefficient.

The second embodiment employs nano carbon, which is excellent in heat dissipation, as a material that adds electrical conductivity to the endless belt, thereby solving the aforementioned problem.

According to the second embodiment, the value of X is in the range of $0.3 \leq X \leq 1.3$. Nano carbon is added to the base material of the endless belt for providing electrical conductivity. Thus, the increase in the surface temperature of the endless belt is minimized. Thus, even when the environmental conditions change due to the changes in temperature and humidity, good transfer performance is maintained and printing can be carried out with high quality.

The first and second embodiments have been described in terms of an endless belt for use in an electrophotographic printer. The endless belt according to the present invention may also be applicable to image forming apparatuses such as copying machines and facsimile machines that form images on a recording medium by an electrophotographic process.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An endless belt that transports a recording medium through an image forming section and transfers a toner image from the image forming section onto the recording medium, the endless belt comprising:
   carbon nano fiber incorporated into the endless belt;
   a surface resistivity; and
   a volume resistivity;
   wherein the surface resistivity and the volume resistivity are related such that $0.3 \leq (\log \rho\ s - \log \rho\ v) \leq 1.3$ where $\rho\ s$ is the surface resistivity in $\Omega/\square$ measured after a voltage of substantially 500 V is applied to the endless belt for ten seconds and $\rho\ v$ is the volume resistivity in $\Omega \cdot cm$ measured after a voltage of substantially 250 V is applied to the endless belt for ten seconds.

2. The endless belt according to claim 1, wherein the endless belt has a single layer structure.

3. The endless belt according to claim 1, wherein the endless belt is made of a base material having a Young's Modulus greater than 200 MPa.

4. The endless belt according to claim 3, wherein the base material is polyamide-imide.

5. The endless belt according to claim 1, wherein a base material of the endless belt is polyamide-imide.

6. The endless belt according to claim 3, wherein the base material is polyimide.

7. The endless belt according to claim 1, wherein a base material of the endless belt is polyimide.

8. The endless belt according to claim 3, wherein the endless belt is made by centrifugal molding.

9. The endless belt according to claim 3, wherein the endless belt is made by using a family mold.

10. An image forming apparatus that incorporates an endless belt according to claim 1, the apparatus comprising:
    a photoconductor;
    a charging unit that charges a surface of the photoconductive drum;
    an exposing unit that illuminates the charged surface of the photoconductor to form an electrostatic latent image;
    a developing unit that develops the electrostatic latent image with toner into a visible image; and
    a transfer unit that transfers the visible image onto a recording medium carried on the endless belt, wherein said endless belt includes carbon nano fiber for adding conductivity to the endless belt.

11. The endless belt according to claim 1, wherein the carbon nano fiber has a diameter in the range of 80 to 150 nm.

12. The endless belt according to claim 1, wherein the carbon nano fiber has a length in the range of 15 to 20 μm.

* * * * *